United States Patent
You et al.

(10) Patent No.: US 11,443,994 B2
(45) Date of Patent: Sep. 13, 2022

(54) ELECTRONIC PACKAGE, ELECTRONIC PACKAGING MODULE HAVING THE ELECTRONIC PACKAGE, AND METHOD FOR FABRICATING THE ELECTRONIC PACKAGE

(71) Applicant: SILICONWAR E PR ECISION INDUSTRIES CO., LT D., Taichung (TW)

(72) Inventors: Jin-Wei You, Taichung (TW); Cheng-Kai Chang, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 260 days.

(21) Appl. No.: 16/858,980

(22) Filed: Apr. 27, 2020

(65) Prior Publication Data
US 2021/0057300 A1 Feb. 25, 2021

(30) Foreign Application Priority Data
Aug. 21, 2019 (TW) .................................. 108129818

(51) Int. Cl.
| | |
|---|---|
| *H01L 23/31* | (2006.01) |
| *H01L 33/54* | (2010.01) |
| *H01L 33/64* | (2010.01) |
| *H01L 23/00* | (2006.01) |
| *H01S 5/026* | (2006.01) |
| *H01L 23/552* | (2006.01) |
| *H01L 25/03* | (2006.01) |
| *H01L 25/10* | (2006.01) |
| *H01L 25/16* | (2006.01) |

(Continued)

(52) U.S. Cl.
CPC .............. *H01L 23/31* (2013.01); *H01L 33/54* (2013.01); *H01L 33/64* (2013.01); *H01S 5/026* (2013.01)

(58) Field of Classification Search
CPC ....... H01S 5/026; H01L 23/552; H01L 25/03; H01L 25/10; H01L 24/19; H01L 24/20; H01L 24/13; H01L 24/16; H01L 24/32; H01L 33/64; H01L 2224/214; H01L 21/486; H01L 23/5226; H01L 2224/02372; H01L 2224/92124
See application file for complete search history.

(56) References Cited

U.S. PATENT DOCUMENTS

| 10,074,615 B1* | 9/2018 | Tseng ................. H01L 21/02008 |
| 2012/0168936 A1* | 7/2012 | Huang ................ H01L 23/3128 |
| | | 257/737 |

(Continued)

FOREIGN PATENT DOCUMENTS

DE 102016203453 A1 * 9/2017 ........... H01L 21/304

*Primary Examiner* — Phat X Cao
*Assistant Examiner* — Antonio B Grite
(74) *Attorney, Agent, or Firm* — Kelly & Kelley, LLP

(57) ABSTRACT

The present application provides an electronic package having an optoelectronic component and a laser component disposed on a packaging unit, with the optoelectronic component and the laser component being separated from each other. Since the laser component and the optoelectronic component are separated from each other, the electronic package has a reduced fabrication difficulty and a high yield rate. A method for fabricating the electronic package and an electronic packaging module having the electronic package are also provided.

20 Claims, 8 Drawing Sheets

(51) Int. Cl.
*H01L 21/683* (2006.01)
*H01L 21/56* (2006.01)
*H01L 25/065* (2006.01)
*H01L 25/18* (2006.01)
*H01S 5/024* (2006.01)
*H01L 21/48* (2006.01)
*H01L 23/498* (2006.01)

(56) References Cited

U.S. PATENT DOCUMENTS

2019/0237374 A1\* 8/2019 Huang .................... H01L 24/19
2020/0227377 A1\* 7/2020 Liff ..................... H01L 21/6835

\* cited by examiner

ELECTRONIC PACKAGE, ELECTRONIC PACKAGING MODULE HAVING THE ELECTRONIC PACKAGE, AND METHOD FOR FABRICATING THE ELECTRONIC PACKAGE

CROSS-REFERENCE TO RELATED APPLICATIONS

This application claims priority to Taiwanese Application Serial No. 108129818, filed on Aug. 21, 2019. The entirety of the application is hereby incorporated by reference herein and made a part of this specification.

BACKGROUND

1. Technical Field

The present disclosure relates to semiconductor packaging techniques, and, more particularly, to an electronic package, an electronic packaging module having the electronic package, and a method for fabricating the electronic package.

2. Description of the Prior Art

With the rapid development in electronic industry, electronic products are having various functions of high performance. In order to meet the miniaturization packaging standard required by an electronic package, a wafer level packaging (WLP) technique was brought to the market.

FIGS. 1A to 1E are cross-sectional views illustrating a method for fabricating a semiconductor package 1 by employing a wafer-level packaging technique according to the prior art.

As shown in FIG. 1A, a thermal release tape 100 is formed on a carrier 10.

Then, a plurality of communication chips 11 are disposed on the thermal release tape 100. Each of the communication chips 11 has an inactive surface 11b and an active surface 11a that opposes the inactive surface 11b, has a plurality of electrode pads 110 thereon, and is adhered onto the thermal release tape 100.

As shown in FIG. 1B, an encapsulation resin 14 is formed on the thermal release tape 100 and encapsulates the communication chips 11.

As shown in FIG. 1C, the encapsulation resin 14 is baked, the thermal release tape 100 is cured, and the thermal release tape 100 and the carrier 10 are removed, to expose the active surfaces 11a of the communication chips 11.

As shown in FIG. 1D, a circuit structure 16 is disposed on the encapsulation resin 14 and the active surfaces 11a of the communication chips 11 and electrically connected to the electrode pads 110. Then, an insulation protection layer 18 is formed on the circuit structure 16, with a portion of a surface of the circuit structure 16 exposed from the insulation protection layer 18 for conductive elements 17, such as solder balls, to be bonded thereto.

As shown in FIG. 1E, a singulation process is performed along a cutting path L shown in FIG. 1D, to obtain a plurality of semiconductor packages 1.

As the data network scaling to meet the ever-increasing bandwidth demand, the drawbacks of a copper data channel (e.g., the circuit of the circuit structure 16) are more and more significant. Signal attenuation and crosstalk due to radiation electromagnetic energy has become the main obstacles that the designer of this system has to address. For instance, the radiation electromagnetic energy between the communication chips 11 causes signal attenuation and crosstalk.

Balancing, encoding and shielding techniques were developed to ease the signal attenuation and crosstalk. However, these techniques need relatively large power, are complex, suffer cable capacity loss, merely improve the suitability for a local area, and has limited scalability.

As technology evolving, the market is in great need of optical communication, and the communication equipment, to which the fiber communication is applied, has low speed (100 Gbps) and cannot meet the need.

According to the prior art, the communication chips 11 are disposed in a same packaging structure. If one of the communication chips 11 malfunctioned, the whole semiconductor package 1, including the remaining well-functioning communication chips 11, will be discarded. The semiconductor package 1 thus has a high replacing cost.

Therefore, how to overcome the drawbacks of the prior art is becoming an urgent issue in the art.

SUMMARY

In view of the drawbacks of the prior art, the present disclosure provides an electronic package, comprising: an encapsulation layer having a first surface, a second surface opposing the first surface, and a lateral surface adjoining the first and second surfaces; a first electronic component embedded in the encapsulation layer; a plurality of conductive pillars embedded in the encapsulation layer; a circuit structure formed on the first surface of the encapsulation layer and electrically connected to the conductive pillars and the first electronic component; a laser component disposed on the circuit structure and electrically connected to the circuit structure; and an optoelectronic component disposed on the circuit structure and electrically connected to the circuit structure, wherein the laser component and the optoelectronic component are separated from each other.

The present disclosure also provides an electronic packaging module, comprising a main board and the above-described electronic package disposed on the main board.

The present disclosure further provides a method for fabricating an electronic package, comprising: disposing a plurality of conductive pillars and at least one first electronic component on a carrying board; forming on the carrying board an encapsulation layer that encapsulates the first electronic component and the conductive pillars and has a first surface, a second surface opposing the first surface and bonded to the carrying board, with end surfaces of the conductive pillars exposed from the first surface of the encapsulation layer; disposing a circuit structure on the first surface of the encapsulation layer and electrically connecting the circuit structure to the conductive pillars and the first electronic component, wherein the encapsulation layer has a lateral surface adjoining the first and second surfaces; disposing a laser component and an optoelectronic component on the circuit structure and electrically connecting the laser component and the optoelectronic component to the circuit structure, wherein the laser component and the optoelectronic component are separated from each other; and removing the carrying board.

In an embodiment, the first electronic component is bonded and electrically connected to a plurality of conductive bodies. In another embodiment, the conductive bodies are embedded in the encapsulation layer and electrically connected to the circuit structure.

In an embodiment, the plurality of conductive pillars surround the first electronic component.

In an embodiment, the laser component protrudes from the lateral surface of the encapsulation layer.

In an embodiment, the optoelectronic component protrudes from the lateral surface of the encapsulation layer.

In an embodiment, the method further comprises disposing a circuit portion on the second surface of the encapsulation layer and electrically connecting the circuit portion to the conductive pillars. In another embodiment, the method further comprises disposing a plurality of conductive elements on the circuit portion.

In an embodiment, the method further comprises disposing a carrying structure on the second surface of the encapsulation layer. In another embodiment, the method further comprises disposing a second electronic component on the carrying structure.

In the electronic package and the method for fabricating the same according to the present disclosure, the first electronic component is used as a trans impedance amplifier and/or a driver, allowing embedded chips to be bridged to homogenous chips, so as to reduce the electric loss of signal transmission, and the conductive pillars provide high current and a shielding effect.

In the electronic package and the method for fabricating the same according to the present disclosure, the laser component and the optoelectronic component are fabricated separately, so as to reduce the fabrication difficulty and increase the yield rate.

In the electronic package and the method for fabricating the same according to the present disclosure, as the laser component is damaged, it is the laser component that is to be replaced, the whole electronic package, including the well-functioning optoelectronic components, can remain without being discarded. Compared with the prior art, the electronic package according to the present disclosure will not waste materials and can reduce the replacement cost at the user end.

BRIEF DESCRIPTION OF THE DRAWINGS

FIG. 2A' is a top view of a portion of FIG. 2A;

FIG. 2D' is a top view of a portion of FIG. 2D;

DETAILED DESCRIPTION

Figure 1A:
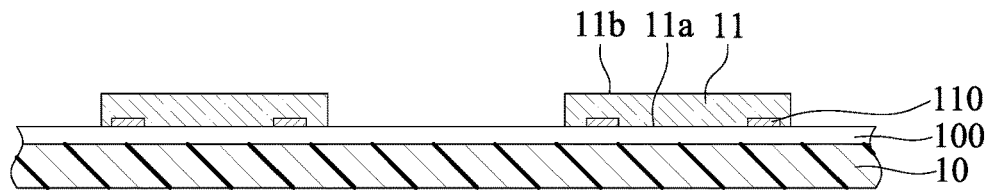
FIGS. 1A to 1E are cross-sectional views illustrating a method for fabricating a semiconductor package according to prior art.
Figure 1B:
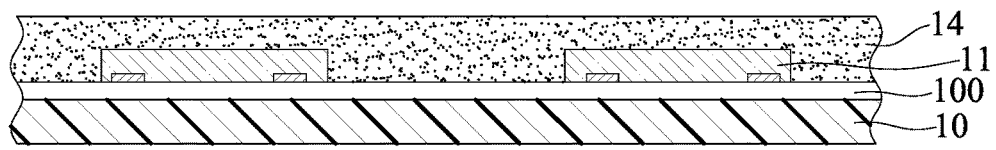
Figure 1C:
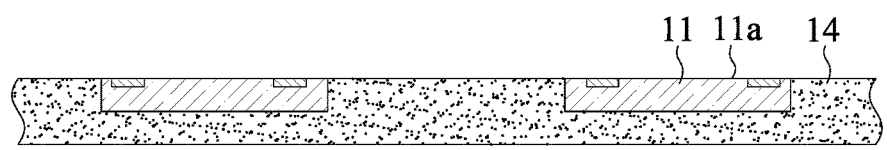
Figure 1D:
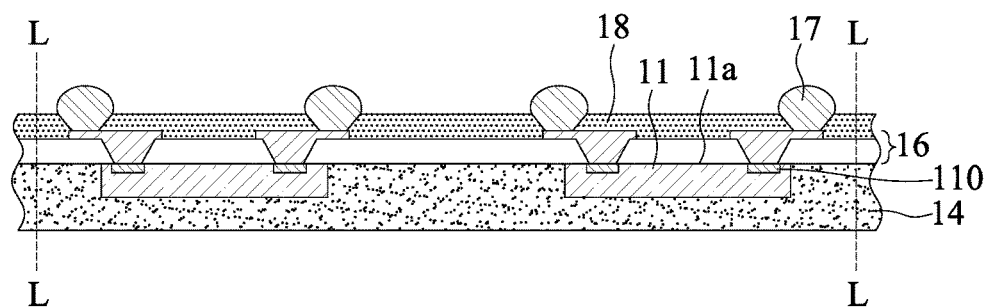
Figure 1E:
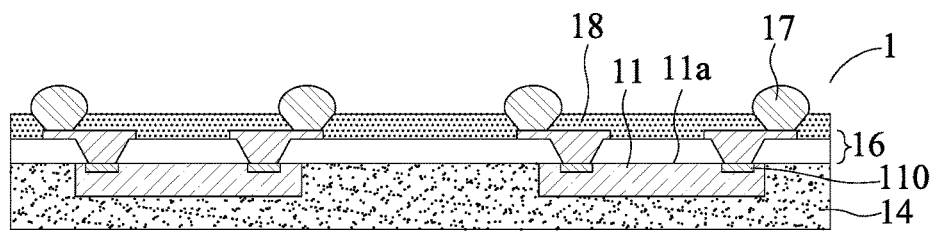

The following illustrative embodiments are provided to illustrate the disclosure of the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the disclosure, and therefore have no substantial technical meaning. Without affecting the effects created and objectives achieved by the disclosure, any modifications, changes or adjustments to the structures, ratio relationships, changes or adjustments are to be construed as fall within the range covered by the technical contents disclosed herein. Meanwhile, terms, such as "above", "beneath", "first," "second," "a" and the like, are for illustrative purposes only, and are not meant to limit the range implementable by the disclosure. Any changes or adjustments made to their relative relationships, without modifying the substantial technical contents, are also to be construed as within the range implementable by the disclosure.

FIGS. 2A to 2E are cross-sectional views illustrating a method for fabricating an electronic package 2 according to the present disclosure.

Figure 2A:
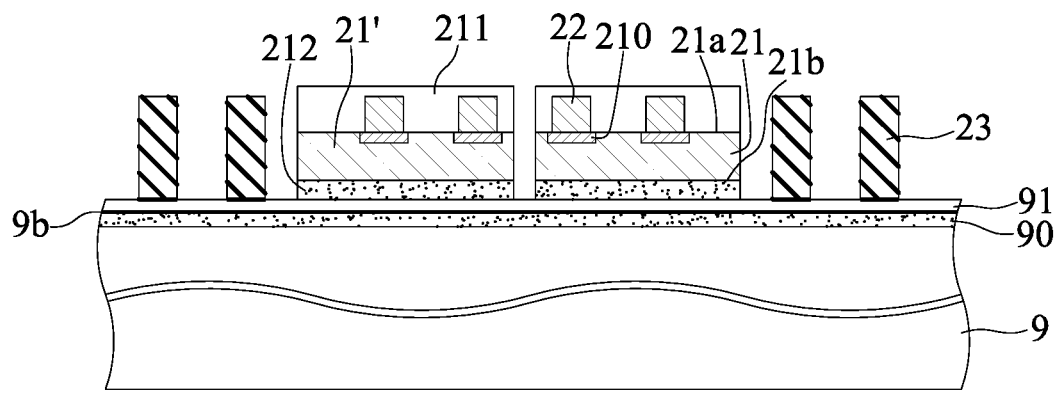
FIGS. 2A to 2E are cross-sectional views illustrating a method for fabricating an electronic package according to the present disclosure.
Figure 2A:
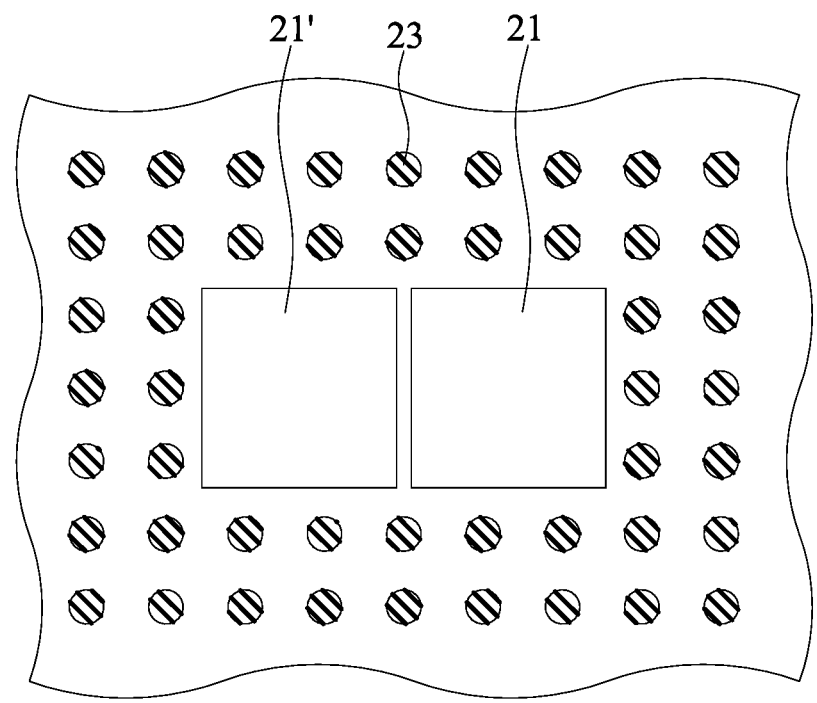

As shown in FIG. 2A, a plurality of conductive pillars 23 and at least one first electronic component 21, 21' (two first electronic components are shown in an embodiment) are disposed on a carrying board 9. A plurality of conductive bodies 22 are bonded onto and electrically connected to the first electronic component 21, 21'.

In an embodiment, the carrying board 9 is a board made of a semiconductor material, such as silicon or glass, and is sequentially applied with a release layer 90, a metal layer 9b such as titanium/copper, and an insulation layer 91 made of a dielectric material or solder mask material, for example. The conductive pillars 23 are disposed on the insulation layer 91.

In an embodiment, the conductive pillars 23 are made of metal, such as copper, or solder tin. In another embodiment, the conductive bodies 22 are in the shape of a ball, such as a conductive circuit or a solder ball, in the shape of a pillar, such as a metal material of a copper pillar and a solder tin bump, or in the shape of a stud, such as conductive element manufactured by a wire bonder.

In an embodiment, the first electronic component 21, 21' is an active element, such as a semiconductor chip, a passive element, such as a resistor, a capacitor and an inductor, or a combination thereof. In an embodiment, the first electronic component 21, 21' is a semiconductor chip, and has an active surface 21a and an inactive surface 21b opposing the active surface 21a. The inactive surface 21b of the first electronic component 21, 21' is adhered via a bonding layer 212 onto the insulation layer 91. The active surface 21a has a plurality of electrode pads 210 and a protection film 211 made of a passivation material, and the conductive bodies 22 are disposed in the protection film 211.

In an embodiment, the first electronic component 21, 21' is a driver or a trans impedance amplifier (TIA) that provides needed functions, such as driving a laser diode or converting an analog signal to a digital signal to increase a signal-to-noise ratio (S/N). In an embodiment, a semiconductor material, such as silicon dioxide ($SiO_2$), is used to fabricate a needed wafer material, and an 8-inch wafer fabrication process is performed in a 130 nm scale, to fabricate the driver or the TIA. In an embodiment, the first electronic component 21 acts as the TIA, and the first electronic component 21' acts as the driver. The TIA (the first electronic component 21) and a limiting amplifier process and convert an optical current converted by an optical sensor into a voltage signal that has a smaller amplitude than the optical current, and a comparator circuit at a rear end converts the voltage signal into a digital signal.

Figure 2B:
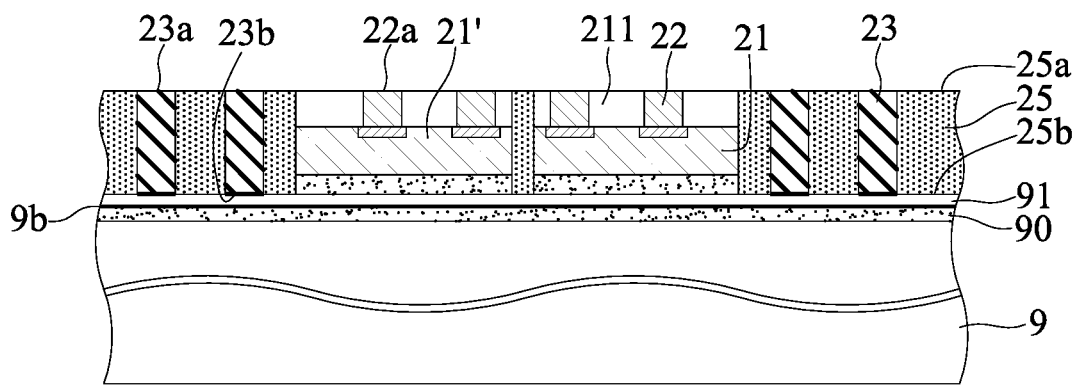

As shown in FIG. 2B, an encapsulation layer 25 is formed on the insulation layer 91 of the carrying board 9 and encapsulates the first electronic component 21, 21', the conductive bodies 22 and the conductive pillars 23. The encapsulation layer 25 has a first surface 25a and a second surface 25b opposing the first surface 25a. The protection film 211, end surfaces 22a of the conductive bodies 22, and end surfaces 23a of the conductive pillars 23 are exposed from the first surface 25a of the encapsulation layer 25. The second surface 25b of the encapsulation layer 25 is bonded onto the insulation layer 91 of the carrying board 9.

In an embodiment, the encapsulation layer 25 is made of an insulation material, such as polyimide (PI), a dry film, an encapsulation resin, such as epoxy, or a molding compound. In another embodiment, the encapsulation layer 25 is formed on the insulation layer 91 by liquid compound, injection, lamination or compression molding.

In an embodiment, a leveling process is performed, allowing the first surface 25a of the encapsulation layer 25 to be flush with the protection film 211, the end surfaces 23a of the conductive pillars 23, and the end surfaces 22a of the conductive bodies 22, and to allow the end surfaces 23a of the conductive pillars 23 and the end surface 22a of the conductive bodies 22 to be exposed from the first surface 25a of the encapsulation layer 25. In another embodiment, the leveling process is performed by grinding and removing a portion of the protection film 211, a portion of the conductive pillars 23, a portion of the conductive bodies 22, and a portion of the encapsulation layer 25.

The other end surfaces 23b of the conductive pillars 23 are flush with the second surface 25b of the encapsulation layer 25.

Figure 2C:
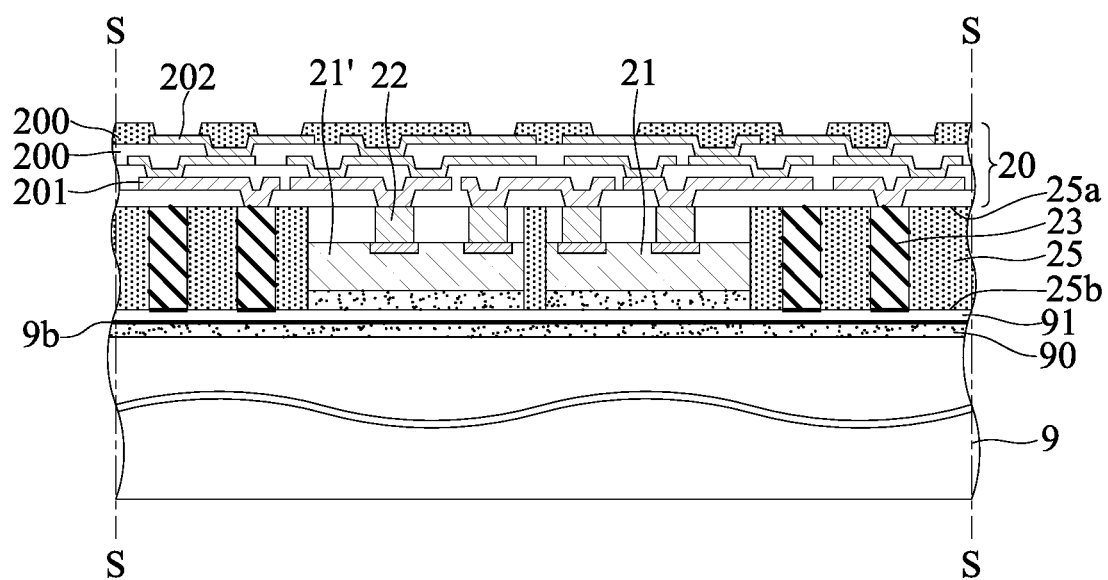

As shown in FIG. 2C, a circuit structure 20 is disposed on the first surface 25a of the encapsulation layer 25, and electrically connected to the conductive pillars 23 and the conductive bodies 22.

In an embodiment, the circuit structure 20 comprises a plurality of insulation layers 200 and a plurality of redistribution layers (RDLs) 201 formed on the insulation layers 200, with the outermost one of the insulation layers 200 acting as a solder mask layer, and the outermost one of redistribution layers 201 exposed from the solder mask layer and acting as a conductive pad 202. In another embodiment, the circuit structure 20 comprises a single insulation layer 200 and a single redistribution layers 201.

In an embodiment, the redistribution layers 201 are made of copper. In another embodiment, the insulation layers 200 are made of a dielectric material, such as polybenzoxazole (PBO), PI, prepreg (PP) etc., or a solder mask material, such as a solder mask or solder resist.

Figure 2D:
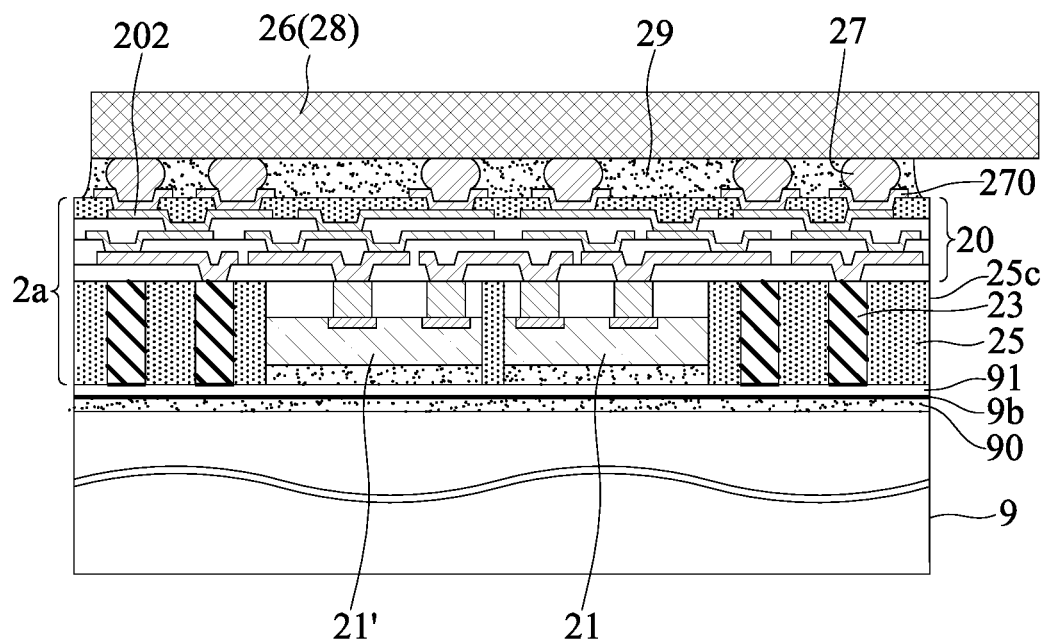
Figure 2D:
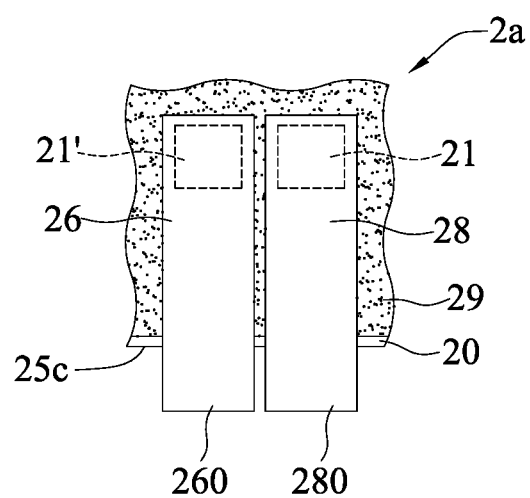

As shown in FIGS. 2D and 2D', a singulation process is performed along a cutting path S shown in FIG. 2C, to obtain a plurality of packaging units 2a. The encapsulation layer 25 further has a lateral surface 25c adjoining the first surface 25a and the second surface 25b. At least one laser component 28 and at least one optoelectronic component 26 are disposed on the circuit structure 20 of the packaging units 2a, and the laser component 28 and/or the optoelectronic component 26 protrudes from the lateral surface 25c of the encapsulation layer 25 to act as a connection segment 280, 260.

In an embodiment, the laser component 28 is a device, such as a laser diode, used for converting an electric signal into an optical signal, to emit an optical signal, such as a laser signal. The laser component 28 emits laser according to a principle: light emitting source→light splitting→light collection→optical fiber connected externally, and deploys the most critical data rate and watt. In an embodiment, the laser component 28 provides vertical-cavity surface-emitting laser (VCSEL) or edge emitting laser. In another embodiment, a semiconductor material, such as InP, GaAs, SiGe, a fin field-effect transistor (FinFET) or a combination thereof is used for fabricating a wafer substrate, and a 4-, 6- or 12-inch wafer process is performed in 130 nm or 65 nm scale, to fabricate the laser diode.

In an embodiment, the optoelectronic component 26 is a device, such as an optical diode, for converting an optical signal into an electric signal to detect an optical signal. In another embodiment, the optoelectronic component 26 can be fabricated into a optoelectronic diode by fabricating a required wafer substrate with a semiconductor material, such as InP, GaAs, silicon-germanium (SiGe), or a combination thereof, and performing a 4- or 6-inch wafer process in 130 nm scale to fabricate the optoelectronic diode.

In an embodiment, the laser component 28 and/or the optoelectronic component 26 is electrically connected to the conductive pads 202 via a plurality of conductive bumps 27, such as solder bumps, copper bumps etc. In an embodiment, under bump metallurgy (UBM) 270 is formed on the conductive pads 202, to be bonded to the conductive bumps 27.

An underfill 29 is formed between the circuit structure 20 and the laser component 28 and/or the optoelectronic component 26 to encapsulate the conductive bumps 27.

Figure 2E:
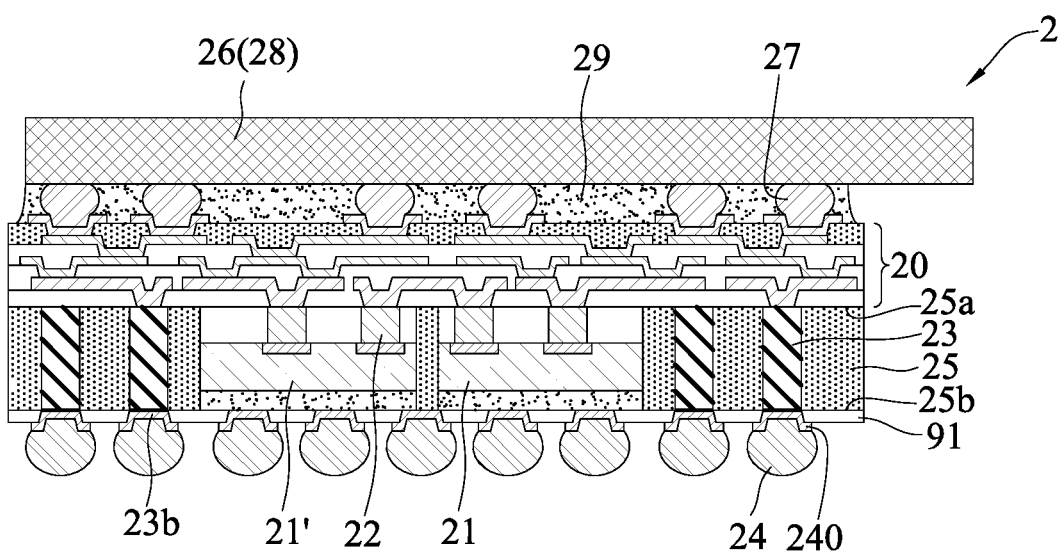

As shown in FIG. 2E, the carrying board 9 and the release layer 90 and the metal layer 9b thereon are removed, with the insulation layer 91 remained. A circuit portion 240 is formed on the insulation layer 91 and electrically connected to the conductive pillars 23, to fabricate the electronic package 2.

In an embodiment, laser is applied to the insulation layer 91 to form a plurality of holes, from which the end surfaces 23b of the conductive pillars 23 and a portion of the second surface 25b of the encapsulation layer 25 are exposed, for the circuit portion 240 to be bonded thereto. In an embodiment, the circuit portion 240 is UBM, for a plurality of conductive elements 24, such as solder bumps or solder balls, to be bonded thereto; alternatively, a circuit portion is formed on the insulation layer 91 in an RDL process, for the conductive elements 24 or UBM to be bonded thereto. In another embodiment, the circuit layer 240 can have various types.

In another embodiment, the carrying board 9 having the insulation layer 91 is provided, for the insulation layer 91 to be used to form the circuit portion 240 after the carrying board 9 is removed. Therefore, a dielectric layer is not needed, and the fabrication time, steps and cost can be reduced.

During operation, the driver (the first electronic component 21') drives the optoelectronic component 26, the connection segment 260 of the optoelectronic component 26 receives and converts an optical signal of an optical fiber cable (not shown) into an electric signal, the circuit structure 20 and the TIA (the first electronic component 21) convert an analog signal into a digital signal, the circuit structure 20 and the laser component 28 convert the digital signal into an optical signal, and the connection segment 280 of the laser component 28 emits the optical signal, such as a laser signal, to another optical fiber cable (not shown).

Figure 3A:
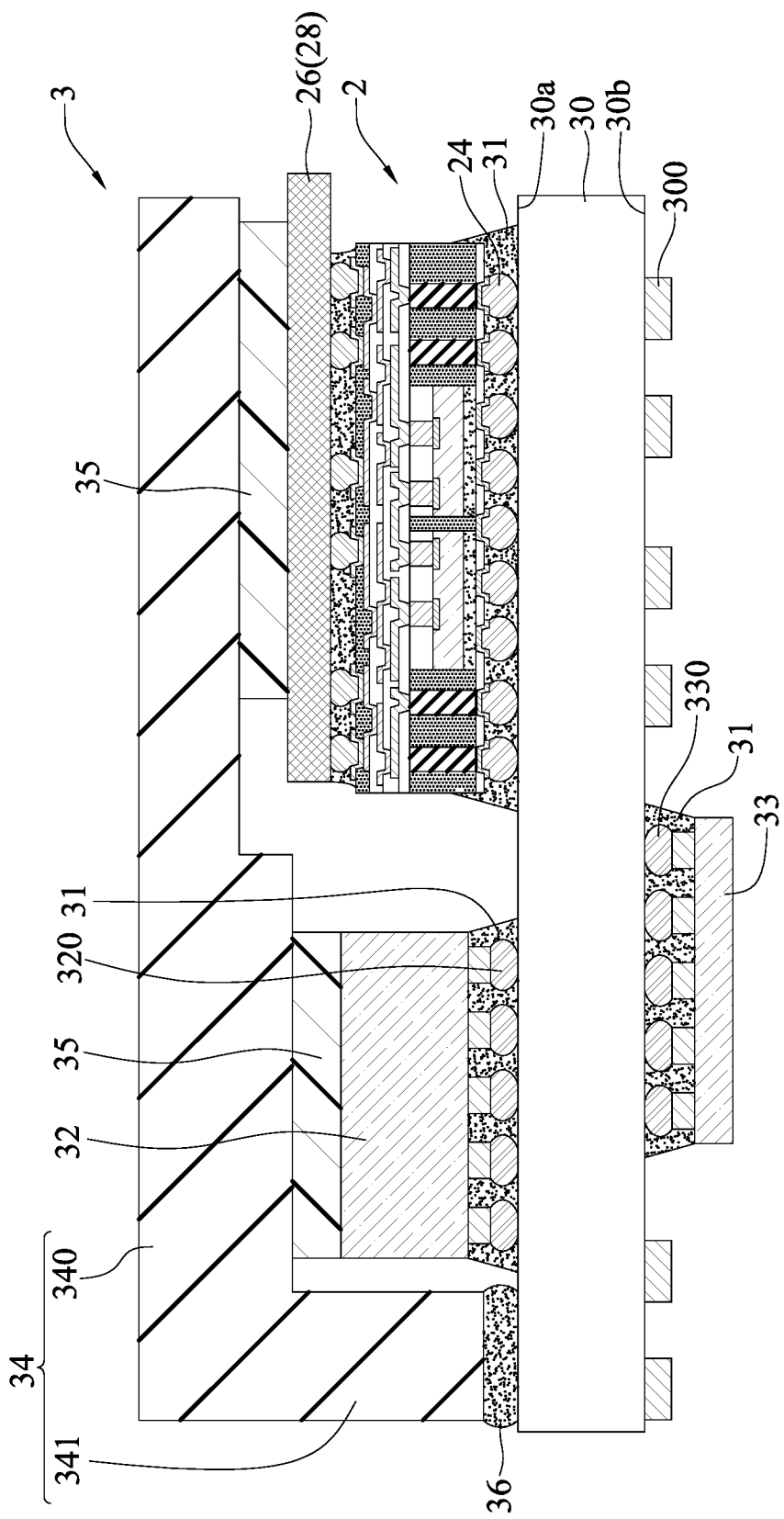
FIG. 3A is a cross-sectional view of an electronic package of another embodiment according to the present disclosure.

As shown in FIG. 3A, the conductive elements 24 are disposed on a carrying structure 30, to form another electronic package 3.

In an embodiment, the carrying structure 30 is in the form of a substrate and has a top surface 30a and a bottom surface 30b opposing the top surface 30a, and the electronic package 2 is disposed on the top surface 30a of the carrying structure 30. In an embodiment, the carrying structure 30 is a packaging substrate having a core layer and a circuit structure or a coreless circuit structure. In another embodiment, the circuit structure comprises at least one insulation layer and at least one circuit layer (e.g., at least one fan out redistribution layer (RDL)) bonded to the insulation layer. In yet another embodiment, the carrying structure 30 may be other boards, such as a lead frame, a wafer, or other carrying boards having metal routings.

In an embodiment, the conductive elements 24 are electrically connected to the carrying structure 30, and an underfill 31 encapsulates the conductive elements 24.

Figure 3B:
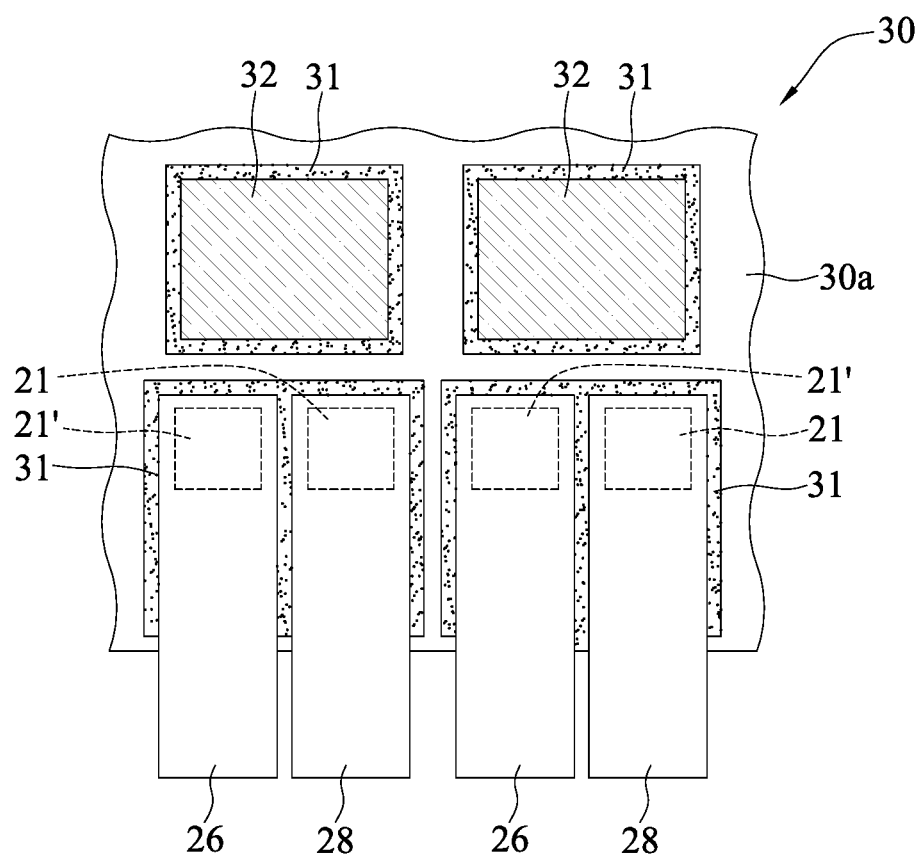
FIG. 3B is a top view of a portion of FIG. 3A.

As shown in FIG. 3B, a plurality of the laser components 28 and/or the optoelectronic components 26 can be disposed on the top surface 30a of the carrying structure 30 on demands, and a plurality of external pads 300 can be disposed on the bottom surface 30b of the carrying structure 30.

In an embodiment, at least one second electronic component 32, a third electronic component 33 and/or a heat sink 34 are disposed on the carrying structure 30 based on functional demands.

The second electronic component 32 is disposed on the top surface 30a of the carrying structure 30. In an embodiment, the second electronic component 32 is an active element, such as a semiconductor chip, a passive element, such as a resistor, a capacitor and an inductor, or a combination thereof. In an embodiment, the second electronic component 32 is a semiconductor chip and is disposed on a circuit layer of the carrying structure 30 and electrically connected to the circuit layer in a flip-chip manner via a plurality of conductive bumps 320, such as a solder material, metal pillars or others, and the underfill 31 encapsulates the conductive bumps 320. In another embodiment, the second electronic component 32 is electrically connected to the circuit layer of the carrying structure 30 in a wire bonding manner via a plurality of bonding wires. In yet another embodiment, the second electronic component 32 is in direct contact with the circuit layer of the carrying structure 30. In still another embodiment, the second electronic component 32 is electrically connected to the carrying structure 30 in other manners.

In an embodiment, based on functional demands, at least one set of clock and data recovery circuit (CDR) (e.g., two sets of CDRs shown in FIG. 3B) is disposed on the second electronic component 32 corresponding to the laser component 28 and the optoelectronic component 26, to provide a serial communication technique, such as SERializer/DESerializer (SERDES), to recover or dismantle signals having the same clocks and act as high frequency band transmission contacts (I/O). In an embodiment, a wafer substrate required is fabricated by a semiconductor material, such as silicon dioxide ($SiO_2$), and an 8-inch wafer fabricating process is performed in a 130 nm scale, to fabricate the second electronic component 32 and its CDR.

For a high speed optical fiber communication system, signals are attenuated severely. In order to avoid that digital signals output from a receiver circuit become deformed and exceed specification, a CDR and a phase-locked loop (PLL) will also be added to a rear stage of the receiver circuit to properly process and then output signals.

The third electronic component 33 is disposed on the bottom surface 30b of the carrying structure 30. In an embodiment, the third electronic component 33 is an active element, such as a semiconductor chip, a passive element, such as a resistor, a capacitor and an inductor, a packaging structure, or a combination thereof. In an embodiment, the third electronic component 33 is a semiconductor chip and is disposed on the circuit layer of the carrying structure 30 and electrically connected to the circuit layer in a flip-chip manner via a plurality of conductive bumps 330, such as a solder material, metal pillars or others, and the underfill 31 encapsulates the conductive bumps 330. In another embodiment, the third electronic component 33 is electrically connected to the circuit layer of the carrying structure 30 in a wire bonding manner via a plurality of bonding wires. In yet another embodiment, the third electronic component 33 in in direct contact with the circuit layer of the carrying structure 30. In still another embodiment, the third electronic component 33 is electrically connected to the carrying structure 30 in other manners.

Based on functional demands, the third electronic component 33 is provided with a power management IC for managing power of a main system.

The heat sink 34 is bonded via a heat dissipating layer 35 onto the laser component 28, the optoelectronic component 26 and the second electronic component 32. In an embodiment, the heat dissipating layer 35 is made of a thermal interface material (TIM), such as a highly thermally conductive resin material. In an embodiment, the heat sink 34 has a heat dissipating body 340 and at least one supporting leg 341 disposed below the heat dissipating body 340. In another embodiment, the heat dissipating body 340 is a heat dissipating plate having a lower side in contact with the heat dissipating layer 35, and the supporting leg 341 is bonded via an adhesion layer 36 to the top surface 30a of the carrying structure 30.

In the method for fabricating an electronic package according to the present disclosure, a Si bridge (i.e., the first electronic components 21 and 21' acting as the TIA and the driver, respectively) allows an embedded chip to be bridged to a homogeneous chip, to reduce the electric loss of signal transmission. The conductive pillars 23, which surround the first electronic component 21, 21', provide a high current and a shielding effect.

The laser component 28 and the optoelectronic component 26 are fabricated separately, which reduces the fabrication difficulty and increases the yield rate.

Under long-term operation, the laser component 28, which emits laser signals, may be damaged due to high heat. As the laser component 28 is damaged, it is the damaged laser component 28 that is to be replaced, and the whole electronic package 2, 3, including the well-functioning optoelectronic component 26, can remain without being discarded. Compared with the prior art, the electronic package according to the present disclosure does not waste materials, and can reduce the replacement cost at a user end.

Figure 4:
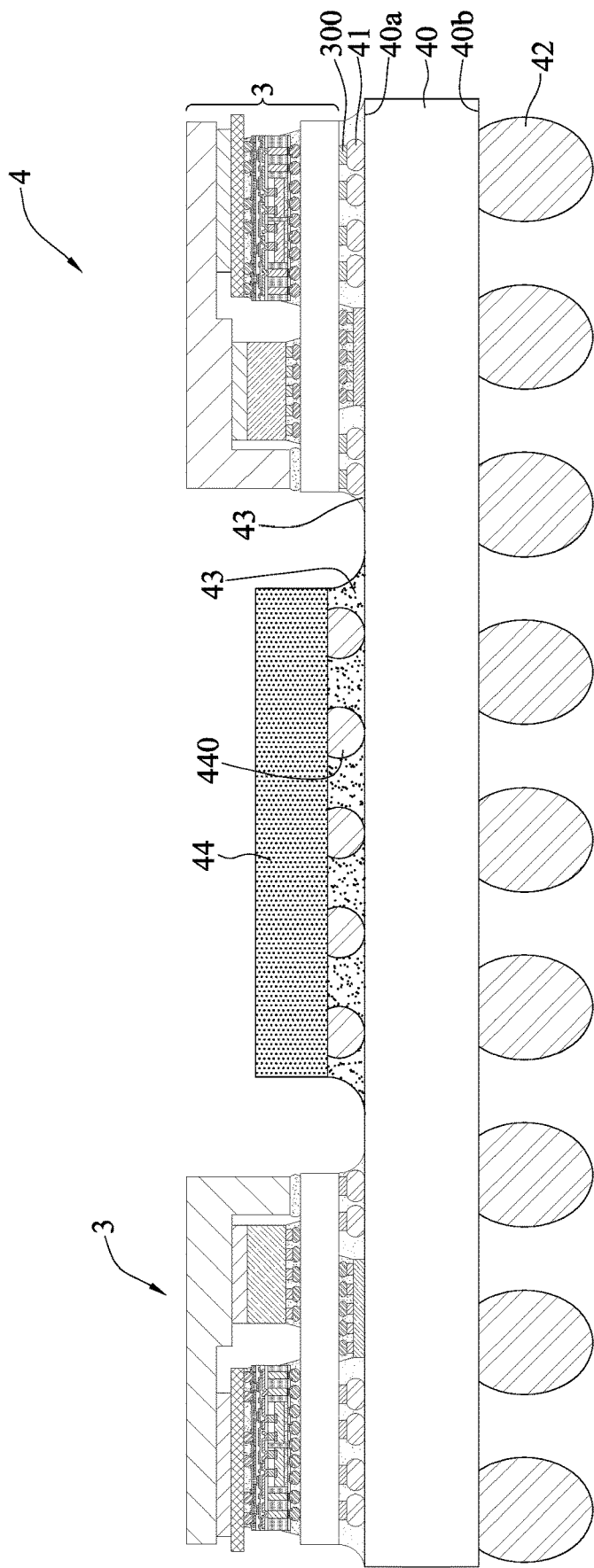
FIG. 4 is a cross-sectional view of an application of FIG. 3A.

As shown in FIG. 4, at least one electronic package 3 shown in FIG. 3A can be disposed on a main board 40, to form an electronic packaging module 4.

In an embodiment, the main board 40 is a circuit board, and has a first side 40a and a second side 40b opposing the first side 40a. In an embodiment, the main board 40 is provided with a fan out circuit, the external pads 300 of the electronic package 3 are disposed on the first side 40a of the main board 40 via a plurality of conductive elements 41 and electrically connected to the circuit of the main board 40, an underfill 43 encapsulates the conductive elements 41 and the third electronic component 33, and the second side 40b of the main board 40 is bonded to a plurality of conductive elements 42, such as a plurality of solder bumps or solder balls, for a circuit board (not shown) to be mounted thereon.

Based on functional demands, at least one fourth electronic component 44 can be disposed on the main board 40.

The fourth electronic component 44 is disposed on the first side 40a of the main board 40. In an embodiment, the fourth electronic component 44 is an active element, such as a semiconductor chip, a passive element, such as a resistor, a capacitor and an inductor, a packaging structure, or a combination thereof. In an embodiment, the fourth electronic component 44 is a packaging structure, disposed on the circuit of the main board 40 in a flip-chip manner via a plurality of conductive bumps 440, such as a solder material, metal pillars or others and electrically connected to the circuit, and the underfill 43 encapsulates the conductive bumps 440. In another embodiment, the fourth electronic component 44 is electrically connected to the circuit of the main board 40 in a wire bonding manner via a plurality of bonding wires. In yet another embodiment, the fourth electronic component 44 is in direct contact with the circuit of the main board 40. In still another embodiment, the fourth electronic component 44 is electrically connected to the main board 40 in other manners.

The present disclosure also provides an electronic package 2, 3, which comprises: an encapsulation layer 25, a plurality of first electronic components 21 and 21', a plurality of conductive pillars 23, a circuit structure 20, at least one laser component 28 and at least one optoelectronic component 26.

The encapsulation layer 25 has a first surface 25a, a second surface 25b opposing the first surface 25a, and a lateral surface 25c adjoining the first and second surfaces 25a and 25b.

The first electronic components 21 and 21' are embedded in the encapsulation layer 25, and a plurality of conductive bodies 22 are bonded and electrically connected to the first electronic components 21 and 21'. The conductive bodies 22 are embedded in the encapsulation layer 25. The end surfaces 22a of the conductive bodies 22 are exposed from the first surface 25a of the encapsulation layer 25.

The conductive pillars 23 are embedded in the encapsulation layer 25, and the end surfaces 22a of the conductive pillars 23 are exposed from the first surface 25a of the encapsulation layer 25.

The circuit structure 20 is disposed on the first surface 25a of the encapsulation layer 25 and electrically connected to the conductive pillars 23 and the conductive bodies 22.

The laser component 28 is disposed on and electrically connected to the circuit structure 20.

The optoelectronic component 26 is disposed on and electrically connected to the circuit structure 20. The laser component 28 and the optoelectronic component 26 are separated from each other and disposed on the circuit structure 20.

In an embodiment, the plurality of conductive pillars 23 surround the first electronic component 21, 21'.

In an embodiment, the laser component 28 protrudes from the lateral surface 25c of the encapsulation layer 25.

In an embodiment, the optoelectronic component 26 protrudes from the lateral surface 25c of the encapsulation layer 25.

In an embodiment, the electronic package 2, 3 further comprises a circuit portion 240 disposed on the second surface 25b of the encapsulation layer 25 and electrically connected to the conductive pillars 23. In another embodiment, the electronic package 2, 3 further comprises a plurality of conductive elements 24 disposed on the circuit portion 240.

In an embodiment, the electronic package 3 further comprises a carrying structure 30 disposed on the second surface 25b of the encapsulation layer 25. In another embodiment, the electronic package 3 further comprises at least one second electronic component 32 disposed on the carrying structure 30.

In the electronic package and the method for fabricating the same according to the present disclosure, the first electronic components act as the TIA and driver, respectively, allowing an embedded chip to be bridged to a homogeneous chip, to reduce the electric loss of signal transmission. The conductive pillars provide a high current and a shielding effect.

The laser component and the optoelectronic component are fabricated separately, which reduces the fabrication difficulty and increases the yield rate.

As the laser component is damaged, it is the damaged laser component that is to be replaced, and the whole electronic package, including the well-functioning optoelectronic component, can remain without being discarded. Compared with the prior art, the electronic package according to the present disclosure will not waste materials and can reduce the replacement cost at the user end.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
an encapsulation layer having a first surface, a second surface opposing the first surface, and a lateral surface adjoining the first surface and the second surface;
a first electronic component embedded in the encapsulation layer;
a plurality of conductive pillars embedded in the encapsulation layer;
a circuit structure formed on the first surface of the encapsulation layer and electrically connected to the conductive pillars and the first electronic component;
a laser component disposed on the circuit structure and electrically connected to the circuit structure; and
an optoelectronic component disposed on the circuit structure and electrically connected to the circuit structure,
wherein the laser component and the optoelectronic component are separated from each other, and wherein at least one of the laser component and the optoelectronic component protrudes from the lateral surface of the encapsulation layer.

2. The electronic package of claim 1, wherein the plurality of conductive pillars surround the first electronic component.

3. The electronic package of claim 1, further comprising a plurality of conductive bodies bonded and electrically connected to the first electronic component.

4. The electronic package of claim 3, wherein the conductive bodies are embedded in the encapsulation layer and electrically connected to the circuit structure.

5. The electronic package of claim 1, further comprising a circuit portion disposed on the second surface of the encapsulation layer and electrically connected to the conductive pillars.

6. The electronic package of claim 5, further comprising a plurality of conductive elements disposed on the circuit portion.

7. An electronic packaging module, comprising:
a main board; and the electronic package of claim 1 disposed on the main board.

8. The electronic packaging module of claim 7, further comprising at least one fourth electronic component disposed on the main board.

9. The electronic package of claim 1, further comprising a carrying structure disposed on the second surface of the encapsulation layer.

10. The electronic package of claim 9, further comprising at least one of a second electronic component and a heat sink disposed on the carrying structure.

11. The electronic package of claim 10, further comprising a third electronic component disposed on the carrying structure.

12. The electronic package of claim 10, further comprising a heat dissipating layer, wherein the heat sink is bonded via the heat dissipating layer to at least one of the laser component and the optoelectronic component.

13. A method for fabricating an electronic package, comprising:
  disposing a plurality of conductive pillars and at least one first electronic component on a carrying board;
  forming on the carrying board an encapsulation layer encapsulating the first electronic component and the conductive pillars, the encapsulation layer having a first surface, a second surface opposing the first surface and bonded to the carrying board, with end surfaces of the conductive pillars exposed from the first surface of the encapsulation layer;
  disposing a circuit structure on the first surface of the encapsulation layer and electrically connecting the circuit structure to the conductive pillars and the first electronic component, wherein the encapsulation layer has a lateral surface adjoining the first surface and the second surface;
  disposing a laser component and an optoelectronic component on the circuit structure and electrically connecting the laser component and the optoelectronic component to the circuit structure, wherein the laser component and the optoelectronic component are separated from each other, and wherein at least one of the laser component and the optoelectronic component protrudes from the lateral surface of the encapsulation layer; and
  removing the carrying board.

14. The method of claim 13, wherein the plurality of conductive pillars surround the first electronic component.

15. The method of claim 13, further comprising providing a plurality of conductive bodies and bonding and electrically connecting the conductive bodies to the first electronic component.

16. The method of claim 15, wherein the conductive bodies are embedded in the encapsulation layer and electrically connected to the circuit structure.

17. The method of claim 13, further comprising disposing a circuit portion on the second surface of the encapsulation layer and electrically connecting the circuit portion to the conductive pillars.

18. The method of claim 17, further comprising disposing a plurality of conductive elements on the circuit portion.

19. The method of claim 13, further comprising disposing a carrying structure on the second surface of the encapsulation layer.

20. The method of claim 19, further comprising disposing a second electronic component on the carrying structure.

* * * * *